United States Patent
Kraft et al.

(10) Patent No.: US 9,122,814 B2
(45) Date of Patent: Sep. 1, 2015

(54) VEHICLE COMPUTING MODULE

(75) Inventors: Guenther Kraft, Karlsruhe (DE);
Thomas Erforth, Karlsruhe (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1113 days.

(21) Appl. No.: 12/796,818

(22) Filed: Jun. 9, 2010

(65) Prior Publication Data
US 2010/0312418 A1 Dec. 9, 2010

(30) Foreign Application Priority Data

Jun. 9, 2009 (EP) .................................... 09007617

(51) Int. Cl.
*B60L 1/00* (2006.01)
*G06F 13/40* (2006.01)

(52) U.S. Cl.
CPC .................................... *G06F 13/409* (2013.01)

(58) Field of Classification Search
USPC .......................................................... 307/9.1
See application file for complete search history.

(56) References Cited

U.S. PATENT DOCUMENTS

| | | | | |
|---|---|---|---|---|
| 5,983,297 | A * | 11/1999 | Noble et al. | 710/312 |
| 6,003,100 | A | 12/1999 | Lee | |
| 6,370,449 | B1 * | 4/2002 | Razavi et al. | 701/1 |
| 7,248,264 | B2 * | 7/2007 | Diamond et al. | 345/520 |
| 7,675,151 | B1 * | 3/2010 | Boone | 257/686 |
| 2004/0099945 | A1 | 5/2004 | Ku | |
| 2004/0264124 | A1 * | 12/2004 | Patel et al. | 361/686 |
| 2007/0150255 | A1 * | 6/2007 | Swoboda et al. | 703/26 |
| 2008/0201515 | A1 * | 8/2008 | Birgin et al. | 710/313 |
| 2009/0157939 | A1 * | 6/2009 | Chu | 710/313 |
| 2009/0288160 | A1 * | 11/2009 | Esliger et al. | 726/17 |
| 2010/0216498 | A1 * | 8/2010 | Mintah et al. | 455/507 |
| 2011/0144858 | A1 * | 6/2011 | Yun et al. | 701/33 |

FOREIGN PATENT DOCUMENTS

EP 1615141 A2 1/2006

* cited by examiner

*Primary Examiner* — Jared Fureman
*Assistant Examiner* — Duc M Pham
(74) *Attorney, Agent, or Firm* — O'Shea Getz P.C.

(57) ABSTRACT

A vehicle computing system includes a vehicle computing module mounted on a main system board. The module includes a computing module circuit board with computing components mounted thereon including a central processing unit and a main memory. An edge connector connects the computing module circuit board to an edge connector socket on the main system board. A plurality of computing function interfaces are connected to the edge connector, and include a configuration interface connected to the central processing unit and, via the edge connector, to a controller on the main system board. The controller configures the central processing unit for operation in the vehicle computing system by enabling specification of the computing function interfaces during a vehicle computing module configuration. The computing function interfaces are configured during the vehicle computing module configuration to process data received by the vehicle computing module via the computing function interfaces.

26 Claims, 3 Drawing Sheets

VEHICLE COMPUTING MODULE

RELATED APPLICATIONS

This application claims priority of European Patent Application Serial Number 09 007 617.5, filed on Jun. 9, 2009, titled VEHICLE COMPUTING MODULE, which application is incorporated in its entirety in this application by reference.

BACKGROUND

1. Field of the Invention

The present invention relates to vehicle computing systems, and more particularly to a vehicle computing module.

2. Related Art

Modern vehicles are increasingly employing functions that are computer-controlled. As an example, a vehicle may include an infotainment system having a computer platform that makes a plurality of information and entertainment functions available to the user. Such functions may include the playback of audio or video files, such as for example, from a CD or a DVD; the execution of navigation software for providing guidance to the driver of the vehicle; or for performing speech recognition. The development of new processors and new system architectures in recent years has dramatically increased the processing power of such infotainment systems within relatively short time spans. Significant increases in performance may be achieved within one to three years. Such dramatic performance improvements may result in the development of media or software that are tailored for these systems, but cannot be played back or executed on older systems.

Vehicle computer systems are often generally configured for a particular type of vehicle, and are fixedly mounted inside the vehicle. The life span of a vehicle may increase to 15 years and beyond; but the computing system of the vehicle becomes outdated after only a small fraction of the vehicle's lifetime. A new computer system that is tailored to the specific vehicle will generally not be available once the model line is discontinued. The users of the vehicle end up tied to their obsolete computer systems unable to benefit from recent developments and improvements in computing systems.

The technology cycles of modern CPUs may be in the range of 1-1.5 years while the standard development cycle for an automotive head unit from the first idea to series production may be more in the range of 3 years. This difference creates a risk that the lifecycle of the new head unit begins with an already outdated processing unit.

Another further problem involves specific requirements that may need to be met in an automotive environment. A common computer system that may be upgradeable by simply exchanging a processor can generally not be employed in an automotive environment. First of all, the computing system is typically customized for the particular type of vehicle. The geometry of the system may need to be adapted to the installation space available, and interfaces may need to be adapted to particular applications. Second, a computing system for a vehicle may need to meet very stringent operating requirements. The computing system may need to ensure a failure-safe operation in a wide range of environmental conditions, such as a wide temperature and humidity range. Due to the limited installation space, the generation of heat raises other important issues that may proscribe the use of conventional computing systems in a vehicle. Connectors and mounting elements used in the computing systems may also not be designed to meet requirements regarding resistance to vibrations for operation in a vehicle.

A need therefore exists for improved vehicle computing systems that enable upgrades involving new processors and new functions.

SUMMARY

In view of the above, a vehicle computing system is provided that includes a vehicle computing module mounted on a main system board. The vehicle computing module includes a computing module circuit board with conducting paths. Computing components are mounted to the computing module circuit board and include at least a central processing unit and a main memory. An edge connector is provided at an edge of the computing module circuit board and adapted to connect the computing module circuit board to an edge connector socket on the main system board. A plurality of computing function interfaces are connected to the edge connector. The plurality of computing function interfaces includes a configuration interface connected to the central processing unit and, via the edge connector, to a controller on the main system board. The controller is used to configure the central processing unit on the computing module circuit board for operation in the vehicle computing system by enabling specification of the computing function interfaces during a vehicle computing module configuration. The computing function interfaces are configured during the vehicle computing module configuration to process data received by the vehicle computing module via the computing function interfaces.

It is to be understood that the features mentioned above and those yet to be explained below can be used not only in the respective combinations indicated, but also in other combinations or in isolation without departing from the scope of the invention.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The description below may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
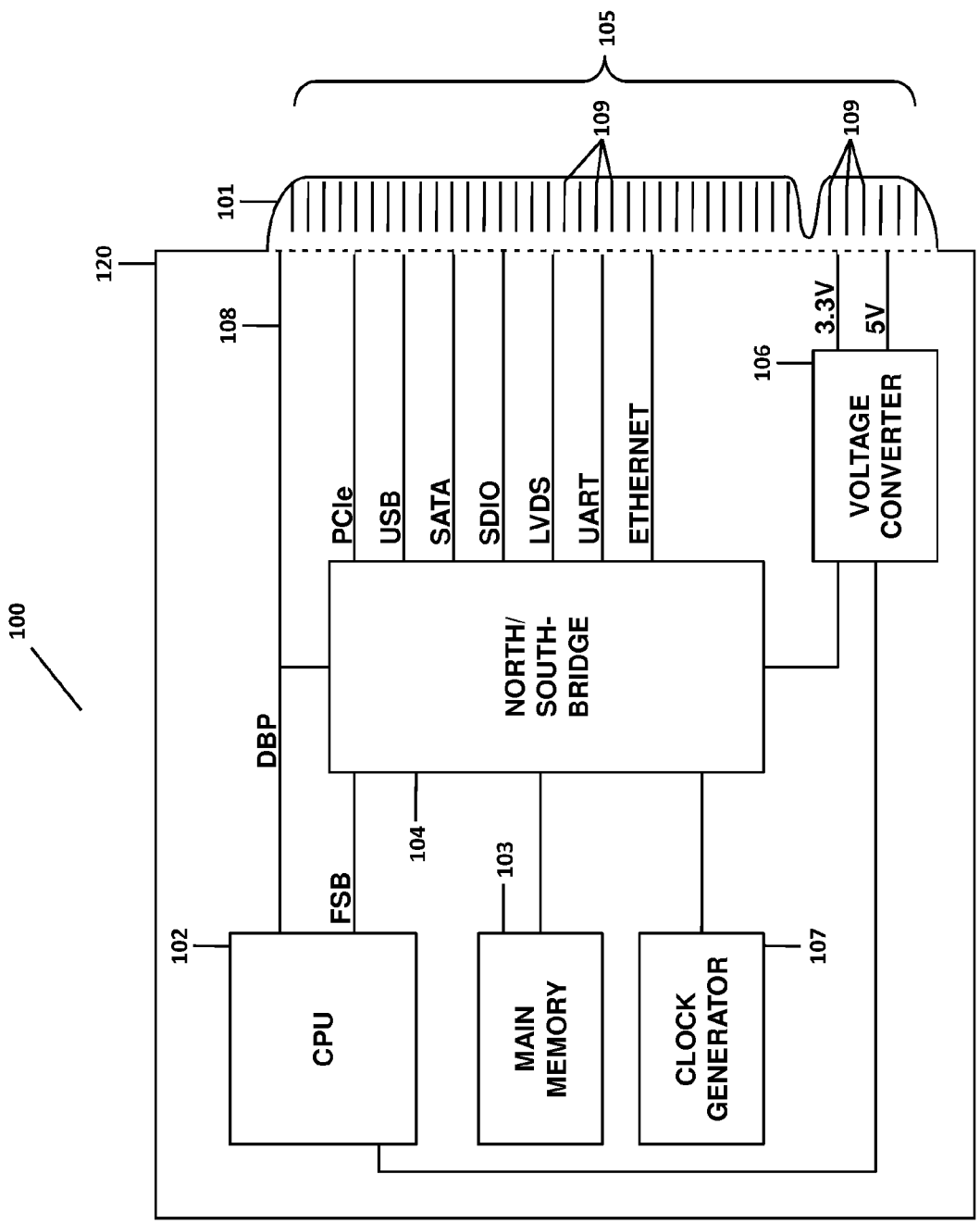
FIG. 1 is a block diagram of an example of a vehicle computing module.

It is to be understood that the following description of examples is given only for the purpose of illustration and is not to be read as limiting. The partitioning of examples in functional blocks or units shown in the drawings is not to be construed as indicating that these units necessarily are implemented as physically separate units, but functional block or units shown or described may be implemented as separate units, circuits, chips or circuit elements, but one or more functional blocks or units may as well be implemented in a common circuit, chip, circuit element or unit.

FIG. 1 is a block diagram of an example of a vehicle computing module 100. Vehicle computing module 100 includes a plurality of computing components including a central processing unit ("CPU") 102, main memory 103, a memory controller 104, and a clock generator 107. The vehicle computing module 100 also includes a voltage converter 106. The computing components and the voltage converter 106 are mounted on a computing module circuit board 120, which includes an edge connector 101. The edge connector 101 includes a plurality of pins 109 and is adapted to fit into a corresponding edge connector socket mounted to a main system board of a vehicle computing system. In one example of an implementation, the edge connector 101 may include 200-250 pins 109. In the following description, 230 pins are assumed as an example merely for purposes of illustration unless otherwise specified. The plurality of pins 109 contact corresponding conducting elements on the edge connector socket when the vehicle computing module 100 is inserted into the edge connector socket.

In one example of an implementation, the plurality of pins 109 have a center-to-center distance, or pitch, of between 0.4 and 0.6 mm. In the following description, a pitch of 0.5 mm is assumed merely for purposes of illustration unless otherwise indicated. The specified pitch may prevent unwanted contact between neighbouring pins 109, which factors in enabling the vehicle computing module 100 to meet requirements regarding the humidity of the environment in which the vehicle computing module 100 operated.

The edge connector 101 provides the vehicle computing module 100 with a plurality of computing function interfaces 105. The computing function interfaces 105 may include a Peripheral Component Interconnect Express (PCIe) interface, a Universal Serial Bus (USB) interface, a Serial Advanced Technology Attachment (SATA) interface, a Secure Digital Input/Output (SDIO) interface, a Low Voltage Differential Signalling (LVDS) interface, a Universal Asynchronous Receiver/Transmitter (UART) interface, an Ethernet interface and two power interfaces (3.3 V and 5 V) for supplying the vehicle computing module 100 with power. These computing function interfaces 105 may be optional as well as optionally combined. For example, the computing function interfaces 105 may include the UART and the Ethernet interfaces, in addition to other optional computing interfaces, such as for example, a display I2C interface, a video in interface, a SM bus interface, a SPI interface, plural General Purpose Input/Output (GPIO) interfaces, a power supply control interface and other interfaces. Table 1 below illustrates an example interface configuration that may be implemented in an example vehicle computing module 100. The second column in Table 1 indicates the number, or quantity, of respective interfaces that may be provided.

TABLE 1

| Interface | # of Interfaces (Up to) | Comment |
|---|---|---|
| PCIexpress, 1 lane | 4 | |
| USB 2.0 | 5 | 4 Host, 1 Function |
| Ethernet | 1 | 10/100/1000 Mbit Base-T MDI (PHY) interface |
| SATA | 2 | |
| SDIO | 3 | 2 × 4 bit, 1 × 8 bit |
| LVDS | 2 | |

TABLE 1-continued

| Interface | # of Interfaces (Up to) | Comment |
|---|---|---|
| Display I2C | 2 | |
| Video In | 1 | BT.656 with 8 bit data |
| DBP | 1 | Generic Debug and Boot Port |
| SMBus | 1 | |
| SPI | 1 | |
| UART | 1 | |
| GPIO | 16 | Up to 12 pins may be for FPGA programming |
| Power Supply Control | 5 | RESET IN/OUT#, WAKE#, SUS_STAT#, POWER_ON |
| Others | 1 | OVER_TEMP |

One or more pins 109 on the edge connector 101 may be assigned to each computing function interface 105. For example, five to ten pins 109 may be assigned to the Debug and Boot Port (DBP) interface shown in Table 1. The GPIO interfaces may, for example, be used for adapting the vehicle computing module 100 to a particular central processing unit (CPU) 102 used on the vehicle computing module 100. The interfaces in Table 1 may be maintained in an interface configuration in vehicle computing modules 100 in which new processor generations or processors/chipsets from different vendors are produced. The interface configuration may ensure the compatibility of the vehicle computing module 100 with the vehicle computing systems installed in the vehicles. The vehicle computing module 100 installed in a vehicle may thus be upgraded with new versions of the vehicle computing module 100 over the lifetime of the vehicle.

The memory controller 104 in the example in FIG. 1 is a combined north/southbridge sub-system, which provides multiple functions to support the computing functions of the computing components. The northbridge generally provides the memory controller 104 functions and the southbridge generally provides input/output controllers for the remaining computing function interfaces 105. The southbridge may for example include a USB controller. The north/southbridge may, for example, be implemented in the form of a one chip solution, such as for example a system controller, which may also include graphics processing functions. Other configurations may also be implemented. For example, the northbridge may be integrated within the CPU 102. Other types of input/output (I/O) hubs may also be employed. The memory controller 104, implemented in FIG. 1 as the combined north/southbridge sub-system, provides an interface for the main memory 103, which may be a random access memory (RAM). The clock generator 107 provides clock signals to the north/southbridge and also to the CPU 102. It is noted that several separate clock generators may be provided for generating clocking signals for the different components of the vehicle computing module 100. The CPU 102 may be any suitable processor, which may include a single core or multi core processor.

The voltage converter 106 generates core voltages from the voltages supplied via the edge connector 101. For example, the voltage converter 106 may receive a core voltage and convert the core voltage to the extent necessary to provide power to the CPU 102. It is noted that the voltage converter 106 may be implemented as a number of physically separate units distributed on the vehicle computing module 100. The vehicle computing module 100 may be provided with a 5 V and 3.3. V powerrail system for optimized load distribution. The use of a single powerrail system is also possible. Optionally, a 3.3 V stand-by powerrail may also be implemented. The voltage converter 106 may also be implemented to generate a range of core voltages, such as 1, 1.5, 1.8, . . . , and 2.5 V.

The DBP interface 108 on the vehicle computing module 100 in FIG. 1 is a generic representation of a dedicated debug and boot port interface of the chipset located on the vehicle computing module 100. The DBP interface 108 of the vehicle computing module 100 may be connected to a debug edge connector of a main system board of the vehicle computing system in which the vehicle computing module 100 operates. The connection of the DBP interface 108 may be made using an unmodified pin assignment independent of the CPU 102 used on the vehicle computing module 100. The DBP interface 108 of the CPU 102 may be accessed via the debug edge connector on the main system board on the vehicle computing system and the edge connector 101 of the vehicle computing module 100. The CPU-specific interface may be configured using off-board tools that may be connected to the debug edge connector. For example, a bus configured under the Low Pin Count ("LPC") bus specification for an Intel® chipset may be assigned to the DBP, while the same signals as for a HUDI interface may be used for a Renesas chipset. The DBP interface 108 allows for a standardized interface pin assignment in a system that supports different processing units or chipsets using different debug interfaces.

Software may be debugged and firmware updated using the DBP interface 108 even if the vehicle computing module 100 is mounted on the vehicle computing system. The vehicle computing system is generally mounted within a small and confined space, which generally prevents access to components on the vehicle computing system without having to un-mount the system. Access from outside the system is provided in an example vehicle computing module 100 by connecting the debug and boot port of the chipset of the vehicle computing module 100 to the edge connector 101 and the debug edge connector of the main system board without having to unmount the computing system.

The vehicle computing module 100 may include components not shown in FIG. 1. For example, the vehicle computing module 100 may include an additional graphics chip for performing graphics processing, a flash memory or a NAND flash memory for storing data, and other similar devices. A flash or NAND flash memory may also be placed on the main system board and accessed via the edge connector 101. Other storage media, such as hard disk drives, may also be located on or connected to the main system board of the computing system and accessed via the edge connector 101. In one example, the SATA interface may be used to access memory on the main system board.

Due to the limited space available for mounting the vehicle computing system, the dimensions of vehicle computing module 100 may be restricted. In an example implementation, the length and width of the vehicle computing module 100 may range from 80×80 mm to 120×120 mm. One such example may be 80×110 mm. The vehicle computing module 100 includes a computing module circuit board 120, which may be implemented as a multi-layer circuit board. Such circuit boards 120 may be produced using the high density interconnect (HDI) or Through-Hole technology. The multi-layer circuit board 120 may have more than six layers, such as for example, 8 to 10 layers. With the HDI circuit board 120, the size of the circuit board 120 may be reduced making it easier to meet requirements regarding signal integrity for the fast bus systems.

The vehicle computing module 100 in FIG. 1 is adapted for use in an automotive environment, which is rather harsh for a computing environment. For example, the vehicle computing module 100 is adapted to operate in a temperature range between −40° C. to 85° C. at different degrees of humidity. Operation at such high temperatures may be achieved by configuring the components of the vehicle computing module 100 to limit power losses to less than 7 W each. The vehicle computing module 100 is configured to operate with total power losses of less than 30 W. The vehicle computing module 100 may also be configured to operate with a total power loss of less than 20 W or even less than 15 W. The components of the vehicle computing module 100 operate at a power loss of above 0.5 to 2 W may be coupled to a module housing or module cover as an indirect heat bridge, or directly to the housing of the vehicle computing system as a direct heat bridge. The components may be provided with materials having a high thermal conductivity, such as heat-conducting pads or heat-conducting paste or other similar heat-conducting materials. Components having a particularly high thermal power loss, such as the CPU 102, may be provided with an integrated heat spreader (IHS) housing to provide a larger surface for heat exchange. The direct coupling or the additional heat spreaders may, for example, be employed for components having a thermal power loss of more than 3 to 5 W.

The vehicle computing module 100 may also be configured to operate in humid heat conditions. In such conditions, condensation can occur and cause a malfunction of the vehicle computing module 100 by, for example, creating a short circuit between circuit traces or other connections. In one example, operation in humid heat conditions may be enabled by keeping the trace to pad, via to pad and pad to pad distances, larger than 200 μm in non-ball grid areas. The ball grid area (BGA) is the area underneath one or more computing components mounted on the circuit board 120 using a ball grid. Computing components typically mounted using a ball grid include components such as the processing unit, the main memory, a controller, an ASIC and other integrated circuits (ICs). Pads may be used to establish an electrical contact to components. Vias, or microvias, may be used to provide electrical connections between traces on different layers of the circuit board 120.

The conducting paths on the outer layers of the computing module circuit board 120 may be covered using a varnish or resist, such as solder resist. The computing module circuit board 120 includes a solder mask having a string width of at least 100 μm. The covers on the conducting paths help prevent leakage currents and other types of malfunctions that may result in damp heat conditions. It should be noted that the solid lines shown in the figures connecting the computing components are schematic representations of connections and do not represent actual traces. The CPU 102 and the north/southbridge 104 may, for example, have many traces connecting them and such traces may run on different layers of the computing module circuit board 120.

The examples of component layouts and arrangements described and outlined above enable the removal heat produced by the components. The heat dissipation enabled by described layouts and arrangements may enable the vehicle computing system to meet the stringent requirements for operating the vehicle computing module 100 inside a vehicle. It should be noted that the specific computing components, such as CPU 102 and north/southbridge 104, are components specified for operation in the temperature ranges indicated above.

Figure 2:
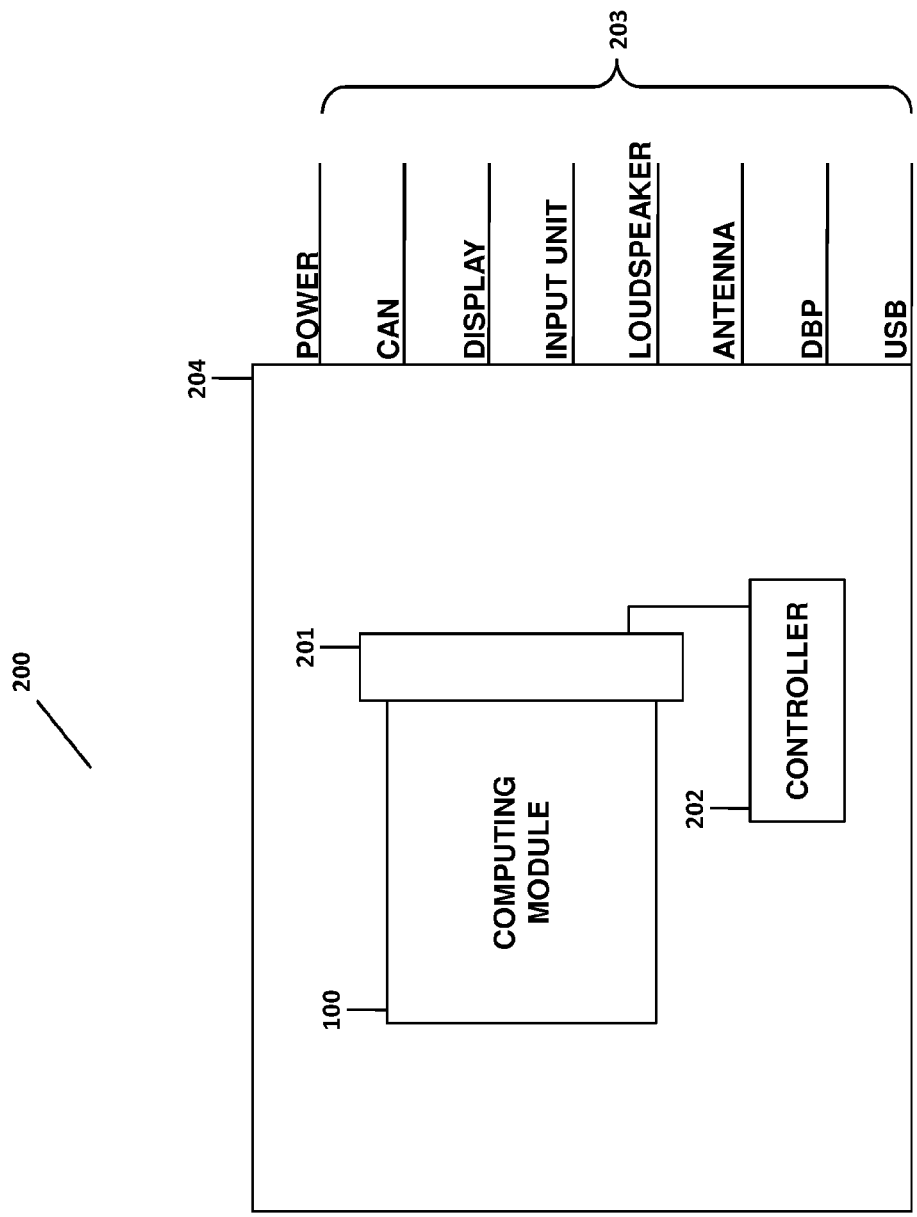
FIG. 2 is a block diagram of an example of a vehicle computing system.

FIG. 2 is a block diagram of an example of a vehicle computing system 200. The vehicle computing system 200 may be an infotainment system, a vehicle navigation system, a vehicle multimedia system, a vehicle control system, or a system that combines functions of each. The vehicle computing system 200 in FIG. 2 includes an edge connector socket 201, a controller 202, the vehicle computing module 100, a plurality of system interfaces 203, and a main system board 204. The vehicle computing system 200 may be mounted, for example, to a single DIN or a double DIN-sized slot of the vehicle.

The vehicle computing module 100 in FIG. 2 is mounted on the main system board 204 of the vehicle computing system 200 by insertion into the edge connector socket 201. The edge connector socket 201 may be selected from edge connector sockets 201 having different heights. In the described examples, the height of the edge connector socket 201 may be between 5 and 8 mm. The edge connector socket 201, or edge card connector, includes contacts corresponding to the pins on the edge connector 101 of the vehicle computing module 100 shown in FIG. 1. The computing module circuit board 120 of the vehicle computing module 100 is configured with a thickness to match the edge connector socket used. As an example, the thickness of the computing module circuit board 120 of the vehicle computing module 100 may be 1.2±0.1 mm. The connection between the vehicle computing module 100 and the edge connector socket 201 in the example shown in FIG. 2 is configured to meet the requirements for use in an automotive environment. For example, requirements for operation in an automotive environments typically include specifications regarding vibrations. Such requirements may be met by selecting or adapting the edge connector socket 201 to meet these requirements. For example, the edge connector socket 201 may be configured to ensure a high enough contact force for contacting the pins of the edge connector 101. The vehicle computing module 100 may also be mechanically fixed to the main system board 204 of the vehicle computing system 200 using bolts, for example, or similar fixing components that may also provide a firm, detachable connection further enabling straightforward removal allowing for easy replacement of the vehicle computing module 100.

The main system board 204 may be configured to the particular type of vehicle in which the vehicle computing system 200 is to be deployed. It may be configured, for example, to include a range of vehicle-specific interfaces, such as a CAN, a LIN or a MOST interface, depending on the particular application, which are implemented as the system interfaces 203 shown in FIG. 2. The system interfaces 203 of the main system board 204 to other components of the vehicle may include an interface to a vehicle-mounted display, a vehicle-mounted input unit, or vehicle-mounted loudspeakers. The system interfaces 203 may also include an antenna, such as a GPS antenna, Bluetooth®, a WLAN antenna, or a radio antenna. The system interfaces 203 may also include an interface to a USB connector mounted to the dashboard of the vehicle or to a face plate of the computing system. The main system board 204 may include application-specific components such as analog audio and video circuits, which may include on the main system board 204 digital-to-analog or analog-to-digital converters, and other application specific components. Some functions of the vehicle computing module 100 may be implemented using interfaces that connect to corresponding interfaces on the vehicle computer system 200, such as the USB interface. The main system board 204 further includes a DBP interface in the form of a main system board debug edge connector for direct connection to the corresponding DBP interface of the vehicle computing module 100. An adaptor may then be connected to the mainboard debug edge connector to enable access to the particular type of CPU 102 used on the vehicle computing module 100.

It is noted that the vehicle computing system 200 may be configured to operate in a specific type of vehicle. The vehicle computing system 200 may be configured in terms of mechanical form factor, connectors and interfaces, for example. In the example shown in FIGS. 1-3, the vehicle computing module 100 may be a standardized module configured as described herein for connection to a range of different types of vehicle computing systems 200. Such interoperability may be provided by standardizing the interface between the vehicle computing module 100 and the main system board 204. In the illustrated examples, standardization may be achieved by providing the interfaces of the vehicle computing module 100 with predetermined functional specifications for the pins of the edge connector 101 in FIG. 1. When adapting the vehicle computing system 200 to the vehicle, the interfaces to the vehicle computing module 100 are thus standardized precluding the need to modify the interfaces. When new generations of processors and chipsets are available, interface converters may be provided on the vehicle computing module 100 to ensure the compatibility with older vehicle computing systems 200. In example implementations, several generations of processing units from different vendors may be supported by taking advantage of the flexibility offered by using the DBP in the standardized interface. The vehicle computing system 200 may offer not only the advantage of producing lower cost vehicle computing modules 100, but also use in a wide range of computing systems enabling production in large numbers. The vehicle computing system 200 may also be easily upgradable to support the latest processors and chipsets available.

The vehicle computing system 200 in FIG. 2 also includes the controller 202, which may be a FPGA, a ASIC or a microcontroller. The controller 202 may be used for configuring the general purpose input/output interfaces to the particular type of CPU 102 used on the vehicle computing module 100. In an example configuration, 16 GPIO ports may be provided with 13 ports reserved for optional FPGA programming, which may be performed, for example, in a slave parallel mode. The FPGA programming may also be performed in a slave serial mode. The vehicle computing system 200 may be specifically configured or adapted to the vehicle computing module 100 that may be later added by programming the controller 202 via the GPIO interfaces. The controller 202 may further perform controlling functions for interfaces between the vehicle computing module 100 and the main system board 204. The controller 202 may also include start-up or boot mechanisms for the vehicle computing system 200. It is noted that the controller 202 may include multiple ASICs, FPGAs, microcontrollers, or combinations of such controllers provided with different functionalities that have been mentioned above.

Figure 3:
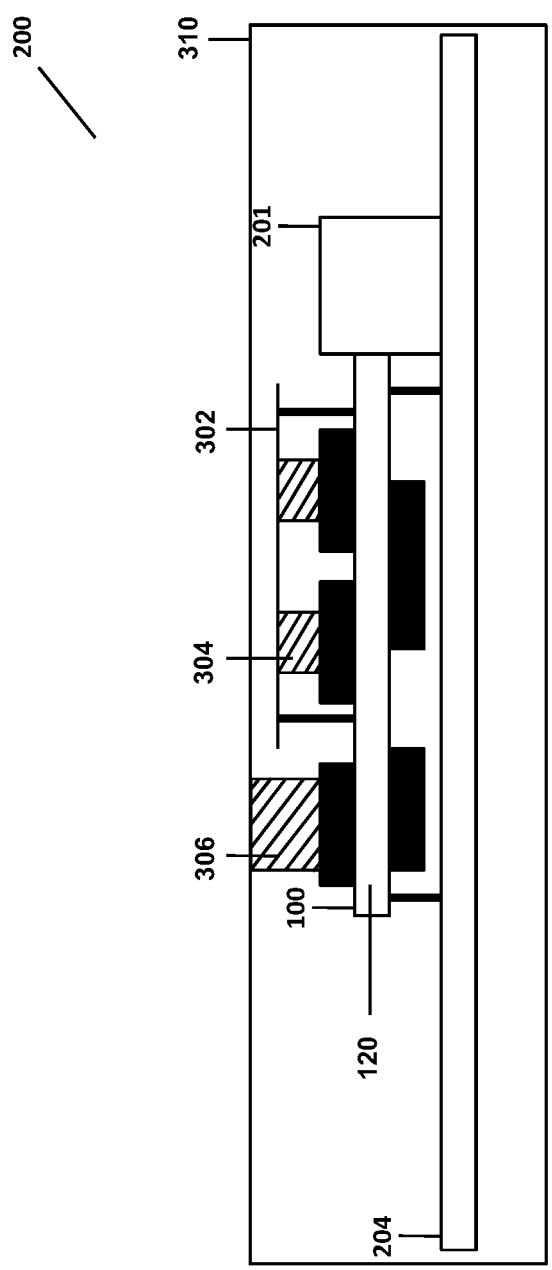
FIG. 3 is a sectional side view of an example of a vehicle computing system.

FIG. 3 is a sectional side view of an example of a vehicle computing system 200 in FIG. 2. FIG. 3 schematically illustrates the distance between the main system board 204 and the vehicle computing module 100 when the vehicle computing module 100 is inserted into the edge connector socket 201. The distance may be selected to allow the vehicle computing module 100 to include computing components mounted on both sides of the vehicle computing module circuit board 120 (shown in FIG. 1). For example, the distance between the computing module circuit board 120 and the main system board 204 may be adjusted to be between 6 to 8 mm. The computing components are indicated in FIG. 3 with black rectangles. The vehicle computing module 100 may be mechanically attached to the main system board 204 using pins, studs or bolts or other similar fixing devices. The vehicle computing module 100 may also include a cover 302. Some of the components on the vehicle computing module 100 may also include heat conducting pads 304 or a similar heat-dissipating component for dissipating heat generated by the computing components. The heat conducting pads 304 may provide a thermal coupling between the cover 100 and the corresponding components. The vehicle computing module 100 may also include computing components directly coupled to a housing 310 that may contain the computing system 200. The components may be coupled to the housing 310 using a second heat conducting pad, or a heat spreader 306. The cover 302 may also be thermally coupled to the housing 310. The combined effect of the heat conducting pads 304 thermally coupled to the computing components on the vehicle computing module 100 and the cover 302 and the heat spreaders 306 thermally coupled to other computing components and the housing 310 may provide an effective removal of the heat generated by the thermal power loss of the computing components.

Examples of vehicle-adapted computing systems using a standardized vehicle computing module that can be employed in a range of differently adapted systems have been described above. Use of an example standardized computing module may provide cost savings in the development and production of vehicle-adapted computing systems. The foregoing description of example implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A vehicle computing module configured for connection to a main system board of a vehicle computing system, the vehicle computing module comprising:
   a computing module circuit board with conducting paths;
   computing components mounted to the computing module circuit board and including at least a central processing unit, a main memory, and at least one of (i) a northbridge and a southbridge or (ii) a combined north/southbridge;
   an edge connector provided at an edge of the computing module circuit board and adapted to connect the computing module circuit board to an edge connector socket on the main system board; and
   a plurality of computing function interfaces connected to the edge connector, the plurality of computing function interfaces including a configuration interface connected to the central processing unit and, via the edge connector, to a controller on the main system board to configure the central processing unit on the computing module circuit board for operation in the vehicle computing system by enabling specification of the computing function interfaces during a vehicle computing module configuration, the computing function interfaces being configured during the vehicle computing module configuration to process data received by the vehicle computing module via the computing function interfaces,
   where at least one of the computing function interfaces is configured to transport data to at least one of a Controller Area Network (CAN) interface and a Media Oriented Systems Transport (MOST) interface on the main system board.

2. The vehicle computing module of claim 1 where the computing function interfaces include at least one of a Peripheral Component Interconnect Express interface, a Universal Serial Bus interface, a Serial Advanced Technology Attachment interface, a Secure Digital Input Output interface, a Low-voltage differential signalling interface, a universal asynchronous receiver/transmitter interface and a power supply control interface.

3. The vehicle computing module of claim 1 where the configuration function interface is used by the controller to configure general purpose input/output interfaces to a specific central processing unit.

4. The vehicle computing module of claim 1 where configuration interface includes a Debug and Boot Port interface directly connected to a corresponding interface provided by the central processing unit.

5. The vehicle computing module of claim 4 where the Debug and Boot Port interface includes connections to at least four pins of the edge connector.

6. The vehicle computing module of claim 1 where the computing components and the computing module circuit board including the conducting paths are configured to meet predetermined specifications for operation inside a vehicle.

7. The vehicle computing module of claim 1 where the computing module circuit board includes one or more ball grid areas and other areas of the computing module circuit board where trace to pad, via to pad, and pad to pad distances are larger than 200 μm.

8. The vehicle computing module of claim 1 where the computing module circuit board includes a solder mask having a string width of at least 100 μm.

9. The vehicle computing module of claim 1 where the computing components and the computing module circuit board are configured to enable the operation of the vehicle computing module within a temperature range of −40 to 70° C.

10. The vehicle computing module of claim 1 where the computing components and the computing module circuit board are configured to enable the operation of the vehicle computing module within a temperature range of between −40 and 85° C.

11. The vehicle computing module of claim 1 where the vehicle computing module includes a module cover connected to a housing of the vehicle computing system, where at least some of the computing components are coupled to the module cover via a thermal bridge configured to dissipate heat generated by the computing components to the module cover.

12. The vehicle computing module of claim 1 where the computing components that have a thermal power loss above a predetermined threshold value include a heat bridge coupled to a housing of the vehicle computing system.

13. The vehicle computing module of claim 1 where each of the computing components is configured to operate with a thermal power loss of less than 7 W.

14. The vehicle computing module of claim 1 where the edge connector includes connections for at least two different operating voltages, a first of the operating voltages lying in a range between 2.5 and 3.5V, and a second of the operating voltages lying in a range between 4.5 and 5.5V.

15. The vehicle computing module of claim 1 where the computing components include a clock generator and a voltage converter.

16. The vehicle computing module of claim 1 where the vehicle computing module includes fixing elements to securely affix the vehicle computing module to the edge connector socket or to the main board.

17. A vehicle computing system comprising:
a main system board having system interfaces to components of the vehicle and an edge connector socket adapted to receive an edge connector;
a controller mounted on the main system board; and
a vehicle computing module connected to the main system board by connection to the edge connector, the vehicle computing module including:
  a computing module circuit board with conducting paths;
  computing components mounted to the computing module circuit board and including at least a central processing unit, a main memory, and at least one of (i) a northbridge and a southbridge or (ii) a combined north/southbridge;
  an edge connector provided at an edge of the computing module circuit board and adapted to connect the computing module circuit board to the edge connector socket of the mainboard; and
  a plurality of computing function interfaces connected to the edge connector for providing an interface to the vehicle computing module, the plurality of computing function interfaces including a configuration interface connected to the central processing unit on the vehicle computing module and, via the edge connector, to the controller on the main system board to configure the central processing unit on the computing module circuit board for operation in the vehicle computing system by enabling specification of the computing function interfaces during a vehicle computing module configuration, the computing function interfaces being configured during the vehicle computing module configuration to process data received by the vehicle computing module via the computing function interfaces,
  where at least one of the computing function interfaces is configured to transport data to at least one of a Controller Area Network (CAN) interface and a Media Oriented Systems Transport (MOST) interface on the main system board.

18. The vehicle computing system of claim 17 where the vehicle computing system is a vehicle-specific system adapted to the particular type of vehicle to which it is to be mounted, and where the vehicle computing module is a standardized vehicle computing module adapted to be used with a plurality of different vehicle computing systems adapted to different types of vehicles.

19. The vehicle computing system of claim 17 where the main system board includes a field-programmable gate array, an application-specific integrated circuit or a microcontroller for controlling the startup of, or the communication with, the vehicle computing module.

20. The vehicle computing system of claim 17 where the edge connector socket is configured so the distance between the main system board and the computing module circuit board of the vehicle computing module is between 2 and 9 mm.

21. The vehicle computing system of claim 17 where the edge connector socket is configured so the distance between the main system board and the computing module circuit board of the vehicle computing module is between 6 and 8 mm.

22. The vehicle computing system of claim 17 further comprising fixing elements arranged to securely affix the vehicle computing module to the edge connector socket or the main system board.

23. The vehicle computing system of claim 17 where the vehicle computing system is selected from a group comprising a vehicle infotainment system, a vehicle multimedia system, a vehicle navigation system, a vehicle control system, and an integrated vehicle computing system combining two or more of these systems.

24. The vehicle computing system of claim 17 where the system interfaces of the main system board to the vehicle include a local interconnect network interface, the main system board being configured to transport data received on these interfaces to the vehicle computing module for processing.

25. A vehicle computing module connected to a main system board of a vehicle computing system, comprising:
a computing module circuit board with conducting paths;
computing components mounted to the computing module circuit board and including at least a central processing unit, a main memory, and at least one of (i) a northbridge and a southbridge or (ii) a combined north/southbridge;
an edge connector provided at an edge of the computing module circuit board and adapted to connect the computing module circuit board to an edge connector socket of the mainboard;
a plurality of system interfaces provided by the edge connector for interfacing the computing module the system interfaces including a configuration interface connected to the central processing unit on the vehicle computing module and, via the edge connector, to a controller on the main system board, and at least a Universal Serial Bus interface, a Secure Digital Input Output interface, and a Low-voltage differential signalling interface; and
where the central processing unit on the computing module circuit board is configured for operation in the vehicle computing system by enabling specification of the computing function interfaces during a vehicle computing module configuration, the computing function interfaces being configured during the vehicle computing module configuration to process data received by the vehicle computing module via the computing function interfaces,
where the system interfaces of the main system board to the vehicle include at least one of a Controller Area Network (CAN) interface and a Media Oriented Systems Transport (MOST) interface, the main system board being configured to transport data received on one of the system interfaces to the vehicle computing module for processing.

26. A vehicle computing module adapted to be connected to a main system board of a vehicle computing system, the vehicle computing module comprising:
a computing module circuit board with conducting paths, the computing module circuit board comprising one or more ball grid areas and being configured such that in areas of the computing module circuit board different from the ball grid areas, trace to pad, via to pad and pad to pad distances are larger than 200 μm;
computing components mounted to the computing module circuit board and including at least a central processing unit, a main memory, and at least one of (i) a northbridge and a southbridge or (ii) a combined north/southbridge;
an edge connector provided at an edge of the computing module circuit board and adapted to connect the computing module circuit board to an edge connector socket of the main system board;
a plurality of system interfaces provided by the edge connector for interfacing the computing module a configuration interface connected to the central processing unit and, via the edge connector, to a controller on the vehicle computing system to configure the central processing unit on the computing module circuit board for operation in the vehicle computing system by configuring the computing function interfaces to process data received by the vehicle computing module via the computing function interfaces; and a plurality of computing function interfaces connected to the edge connector for providing an interface to the vehicle computing module, the plurality of computing function interfaces including a configuration interface connected to the central processing unit on the vehicle computing module and, via the edge connector, to the controller on the main system board to configure the central processing unit on the computing module circuit board for operation in the vehicle computing system by enabling specification of the computing function interfaces during a vehicle computing module configuration, the computing function interfaces being configured during the vehicle computing module configuration to process data received by the vehicle computing module via the computing function interfaces, where at least one of the computing function interfaces is configured to transport data to at least one of a Controller Area Network (CAN) interface and a Media Oriented Systems Transport (MOST) interface on the main system board.

\* \* \* \* \*